(12) United States Patent
Lavine

(10) Patent No.: US 12,191,622 B2
(45) Date of Patent: Jan. 7, 2025

(54) HIGH-ENERGY LASER APPARATUS FOR THIN FILM TEMPERTURE SENSING

(71) Applicant: RAYTHEON COMPANY, Waltham, MA (US)

(72) Inventor: Jason R. Lavine, McKinney, TX (US)

(73) Assignee: RAYTHEON COMPANY, Waltham, MA (US)

( * ) Notice: Subject to any disclaimer, the term of this patent is extended or adjusted under 35 U.S.C. 154(b) by 380 days.

(21) Appl. No.: 17/320,074

(22) Filed: May 13, 2021

(65) Prior Publication Data

US 2022/0013976 A1 Jan. 13, 2022

Related U.S. Application Data

(60) Provisional application No. 63/051,017, filed on Jul. 13, 2020.

(51) Int. Cl.
| | |
|---|---|
| *H01S 3/02* | (2006.01) |
| *G01K 7/22* | (2006.01) |
| *H01S 3/08* | (2023.01) |
| *H01S 5/02* | (2006.01) |
| *G02B 5/08* | (2006.01) |
| *H01S 3/00* | (2006.01) |

(52) U.S. Cl.
CPC ............... *H01S 3/025* (2013.01); *G01K 7/22* (2013.01); *H01S 3/08059* (2013.01); *H01S 5/0206* (2013.01); *H01S 5/0213* (2013.01); *G02B 5/0816* (2013.01); *H01S 3/005* (2013.01); *H01S 3/0071* (2013.01)

(58) Field of Classification Search
CPC .... H01S 3/025; H01S 3/08059; H01S 5/0206; H01S 5/0213; H01S 3/005; H01S 3/0071; G01K 7/22; G02B 5/0816
See application file for complete search history.

(56) References Cited

U.S. PATENT DOCUMENTS

| | | | |
|---|---|---|---|
| 3,895,313 A * | 7/1975 | Seitz | .......................... H01S 3/08 428/912.2 |
| 5,850,412 A * | 12/1998 | Eguchi | ..................... H01S 3/005 372/109 |
| 6,239,033 B1 * | 5/2001 | Kawai | ................. H01L 33/0093 257/E29.317 |

(Continued)

FOREIGN PATENT DOCUMENTS

| | | |
|---|---|---|
| EP | 0798572 A1 | 1/1997 |
| EP | 15738668 A | 5/2018 |
| JP | 06235806 A | 8/1994 |

OTHER PUBLICATIONS

International Search Report Application No. PCT/US2021/039694; Issued Oct. 28, 2021; pp. 5.

(Continued)

*Primary Examiner* — Nathaniel T Woodward
*Assistant Examiner* — Philip L Cotey
(74) *Attorney, Agent, or Firm* — CANTOR COLBURN LLP

(57) ABSTRACT

A high-energy laser (HEL) element is provided and includes a non-conductive substrate layer assembly, a reflector layer assembly and a thermally conductive carbon layer. The thermally conductive carbon layer is at least partially interposed between the non-conductive substrate layer assembly and the reflector layer assembly.

16 Claims, 2 Drawing Sheets

(56) References Cited

U.S. PATENT DOCUMENTS

| | | | | |
|---|---|---|---|---|
| 7,708,415 B2* | 5/2010 | Griffith | ............. | G02B 26/0825 |
| | | | | 359/846 |
| 8,275,009 B2* | 9/2012 | Yu | ....................... | H04N 9/3161 |
| | | | | 372/22 |
| 9,407,057 B2* | 8/2016 | Kiyko | .................... | H01S 3/0818 |
| 9,835,778 B1* | 12/2017 | Xing | .................... | G02B 5/1861 |
| 10,018,830 B1* | 7/2018 | Woodruff | ................. | H01S 3/005 |
| 10,191,190 B2* | 1/2019 | Dodson | ................ | G02B 5/0858 |
| 2002/0114374 A1* | 8/2002 | Exel | .................... | G02B 7/1815 |
| | | | | 372/99 |
| 2005/0180472 A1* | 8/2005 | Tzuk | ....................... | H01S 3/042 |
| | | | | 372/36 |
| 2005/0254111 A1* | 11/2005 | Griffith | ............. | G02B 26/0858 |
| | | | | 359/224.1 |
| 2008/0037146 A1* | 2/2008 | Griffith | ............. | G02B 26/0825 |
| | | | | 359/845 |
| 2011/0286075 A1* | 11/2011 | Bruchmann | ......... | G02B 7/1815 |
| | | | | 29/25.35 |
| 2014/0218795 A1* | 8/2014 | Scerbak | .................. | G02F 1/093 |
| | | | | 359/484.04 |
| 2015/0218694 A1* | 8/2015 | Xu | ......................... | C23C 28/04 |
| | | | | 428/206 |
| 2015/0234195 A1* | 8/2015 | Honea | ................. | G02B 27/0905 |
| | | | | 359/618 |
| 2016/0320534 A1* | 11/2016 | Dodson | ................ | G02B 5/0858 |
| 2017/0068097 A1* | 3/2017 | Honea | ................ | G02B 27/0944 |
| 2019/0097379 A1* | 3/2019 | Wada | ..................... | H01S 3/093 |
| 2020/0335931 A1* | 10/2020 | Song | .................... | H01S 3/06783 |
| 2021/0119398 A1* | 4/2021 | Kuntze | ............... | H01S 3/08059 |

OTHER PUBLICATIONS

Written Opinion Application No. PCT/US2021/039694; Issued Oct. 28, 2021; pp. 9.

* cited by examiner

** HIGH-ENERGY LASER APPARATUS FOR THIN FILM TEMPERTURE SENSING

DOMESTIC PRIORITY

This application claims priority to U.S. Provisional Application Ser. No. 63/051,017, filed Jul. 13, 2020, the contents of which are incorporated by reference herein in its entirety.

BACKGROUND

The present disclosure relates to a high-energy laser apparatus and, in particular, to a high-energy laser apparatus with an integrated carbon base layer.

Continuous wave high-energy laser (HEL) tests suggest that highly thermally conductive optical substrates (e.g., single-crystal silicon and aluminum) are anecdotally more impervious to becoming damaged due to foreign object debris (FOD) collection or other similar situations than non-conductive substrates (e.g., fused silica). In particular, certain thermally conductive substrates show promise in testing to have relatively poor surface quality but relatively very good damage resistance as compared to similar non-conductive substrates with better polish characteristics.

It is believed that thermally conductive optics that survive past fluence testing procedures in a "clean" state (e.g., without infantile failures) are likely to survive certain other operations with increased "dirtiness". It has been seen that core issues for long-term survivability of optics in certain tactical environments appears to be related to cleanliness.

Thus, many systems have been designed toward decreasing fluence to thereby reduce particulate damage risks or to have non-common path systems that do not require non-conductive substrates. In some instances, diamond windows have been grown but are typically too thin for tactical applications by themselves at practical sizes.

SUMMARY

According to an aspect of the disclosure, a high-energy laser (HEL) element is provided and includes a non-conductive substrate layer assembly, a reflector layer assembly and a thermally conductive carbon layer. The thermally conductive carbon layer is partially interposed between the non-conductive substrate layer assembly and the reflector layer assembly.

In accordance with additional or alternative embodiments, the thermally conductive carbon layer includes at least one of a diamond-like carbon crystal growth layer and/or a diamond crystal growth layer.

In accordance with additional or alternative embodiments, the non-conductive substrate layer assembly includes a non-conductive substrate and one or more thermal matching layers interposed between the non-conductive substrate and the thermally conductive carbon layer.

In accordance with additional or alternative embodiments, the reflector layer assembly includes multiple broadband high-reflector layers.

In accordance with additional or alternative embodiments, the thermally conductive carbon layer includes a planar layer axially interposed between the non-conductive substrate layer assembly and the reflector layer assembly and sidewalls extending around a portion of the non-conductive substrate layer assembly.

In accordance with additional or alternative embodiments, a thermal sensor is coupled to the thermally conductive carbon layer.

In accordance with additional or alternative embodiments, the thermal sensor is outside an aperture defined by the reflector layers.

In accordance with additional or alternative embodiments, the thermal sensor includes at least one of a first thermistor coupled to a first surface of the thermally conductive carbon layer and a second thermistor coupled to a second surface of the thermally conductive carbon layer, which is perpendicular to the first surface of the thermally conductive carbon layer.

According to an aspect of the disclosure, a high-energy laser (HEL) element is provided and includes a non-conductive substrate layer assembly, a reflector layer assembly adjacent to the non-conductive substrate layer assembly and including multiple broadband high-reflector layers and a thermally conductive carbon layer. The thermally conductive carbon layer is at least partially interposed between first and second ones of the multiple broadband high-reflector layers.

In accordance with additional or alternative embodiments, the thermally conductive carbon layer includes at least one of a diamond-like carbon crystal growth layer and/or a diamond crystal growth layer.

In accordance with additional or alternative embodiments, the non-conductive substrate layer assembly includes a non-conductive substrate and one or more thermal matching layers interposed between the non-conductive substrate and the reflector layer assembly.

In accordance with additional or alternative embodiments, a thermal sensor is coupled to the thermally conductive carbon layer.

In accordance with additional or alternative embodiments, the thermal sensor is outside an aperture defined by the reflector layers.

In accordance with additional or alternative embodiments, the thermal sensor includes at least one of a first thermistor coupled to a first surface of the thermally conductive carbon layer and a second thermistor coupled to a second surface of the thermally conductive carbon layer, which is perpendicular to the first surface of the thermally conductive carbon layer.

According to an aspect of the disclosure, a method of assembling a high-energy laser (HEL) element is provided and includes forming a non-conductive substrate layer assembly, growing a thermally conductive carbon layer on the non-conductive substrate layer assembly, masking a portion of a surface of the thermally conductive carbon layer facing away from the non-conductive substrate layer assembly, attaching a reflector layer assembly to an unmasked portion of the surface and coupling a thermal sensor to the portion of the surface following an unmasking of the portion of the surface.

In accordance with additional or alternative embodiments, the forming of the non-conductive substrate layer assembly includes polishing a surface of a non-conductive substrate.

In accordance with additional or alternative embodiments, the forming of the non-conductive substrate layer assembly further includes applying one or more thermal matching layers to the surface of the non-conductive substrate.

In accordance with additional or alternative embodiments, the growing of the thermally conductive carbon layer includes over-spraying of at least one of diamond-like carbon and/or diamond.

In accordance with additional or alternative embodiments, the attaching of the reflector layer assembly to the unmasked portion of the surface includes assembling multiple broadband high-reflector layers and patterning the multiple broadband high-reflector layers to define an aperture in which the thermal sensor is disposable.

In accordance with additional or alternative embodiments, the coupling of the thermal sensor to the portion of the surface includes coupling a first thermistor to the portion of the surface and coupling a second thermistor to an additional surface perpendicular to the portion of the surface.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As will be described below, a layer of thermally conductive carbon such as, but not limited to, diamond or diamond-like carbon (DLC), is provided underneath or between high-reflector layers in HEL elements. The layer of thermally conductive carbon maintains a relatively good surface finish through sputtering or polishing operations, serves to spread heat until FOD is ablated or until shot completion instead of causing substrate damage and allows for active monitoring by a thermistor or another thermal sensor.

Figure 1:
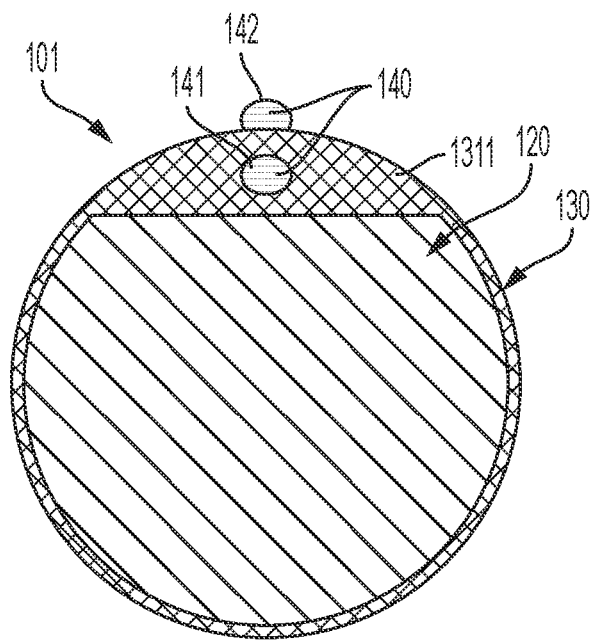
FIG. 1 is a plan view of a high-energy laser (HEL) element in accordance with embodiments.
Figure 2:
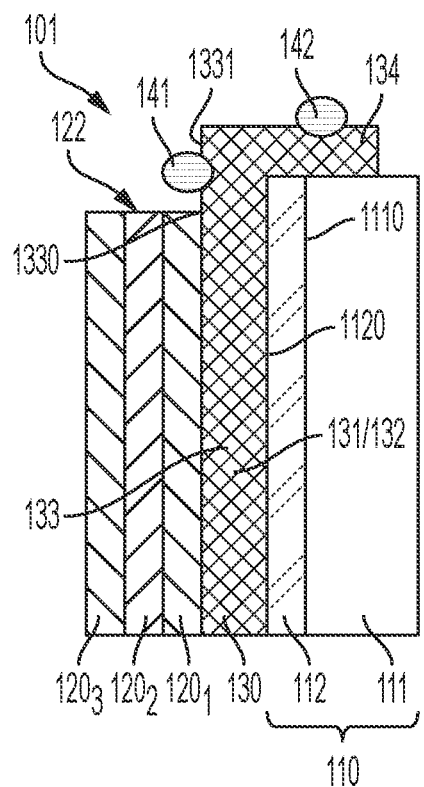
FIG. 2 is a side view of the HEL element of FIG. 1.

With reference to FIGS. 1 and 2, an HEL element 101 is provided and includes a non-conductive substrate layer assembly 110, a reflector layer assembly 120 and a thermally conductive carbon layer 130. The non-conductive substrate layer assembly 110 includes a non-conductive substrate 111 with at least a major surface 1110 that is polished or super-polished and, in some cases, one or more thermal matching layers 112 (hereinafter, the one or more thermal matching layers 112 will be referred to as a single thermal matching layer 112 for purposes of clarity and brevity). The non-conductive substrate 111 can be formed of fused silica, for example. Where applicable, thermal matching layer 112 can be interposed between the major surface 1110 of the non-conductive substrate 111 and the thermally conductive carbon layer 130 to provide coefficient of thermal expansion (CTE) matching between the non-conductive substrate 111 and the thermally conductive carbon layer 130. The reflector layer assembly 120 can include multiple broadband high-reflector layers $120_1$, $120_2$, $120_3$, ..., $120_n$ (only multiple broadband high-reflector layers $120_1$, $120_2$, $120_3$ are shown).

The thermally conductive carbon layer 130 includes at least one of a diamond-like carbon crystal growth layer 131 and a diamond crystal growth layer 132 that is grown on or placed on or sprayed onto the major surface 1110 of the non-conductive substrate 111 of the non-conductive substrate layer assembly 110 in those cases in which no thermal matching layer 112 or general adhesion layer is provided. Conversely, where the non-conductive substrate layer assembly 110 includes the thermal matching layer 112, the thermally conductive carbon layer 130 can be grown on or placed on or sprayed onto a major surface 1120 of the thermal matching layer 112. In those cases where the thermally conductive carbon layer 130 is placed on the major surface 1110 of the non-conductive substrate 111 or the major surface 1120 of the thermal matching layer 112, the thermally conductive carbon layer 130 can be provided as a pre-grown diamond substrate.

The following description will be directed to those cases in which the non-conductive substrate layer assembly 110 includes the thermal matching layer 112. This is done for purposes of clarity and brevity and should not be interpreted as limiting of the overall scope of the disclosure in any way.

The thermally conductive carbon layer 130 is at least partially interposed between the major surface 1120 of the thermal matching layer 112 of the non-conductive substrate layer assembly 110 and a proximal one of the multiple broadband high-reflector layers $120_1$, $120_2$, ..., $120_n$ of the reflector layer assembly 120 (i.e., broadband high-reflector layer $120_1$). In this way, the thermally conductive carbon layer 130 acts as a heat spreader for the non-conductive substrate layer assembly 110 and the HEL element 101 as a whole. In particular, where the reflector layer assembly 120 has FOD disposed thereon and the HEL is incident on the FOD disposed on the reflector layer assembly 120 and thus causes a temperature increase for the HEL element 101, the thermally conductive carbon layer 130 spreads the heat.

In greater detail and as shown in FIG. 2, the thermally conductive carbon layer 130 can include a planar layer portion 133 and sidewall portions 134. The planar layer portion 133 is axially interposed between the major surface 1120 of the thermal matching layer 112 of the non-conductive substrate layer assembly 110 and the proximal one of the multiple broadband high-reflector layers $120_1$, $120_2$, ..., $120_n$ of the reflector layer assembly 120 (i.e., broadband high-reflector layer $120_1$). The sidewall portions 134 extend around a portion of the non-conductive substrate layer assembly 110.

A major surface 1330 of the planar layer portion 133 corresponds to the major surface 1120 and has a greater dimension (i.e., diameter) than the non-conductive substrate layer assembly 110. The reflector layer assembly 120 can be formed with a cut-out or aperture 122 that exposes a section 1331 of the major surface 1330 of the planar layer portion 133. Respective shapes of the cut-out or aperture 122 and the section 1331 correspond to one another and can be provided in multiple forms including, but not limited to, a chordal section as shown in FIG. 2.

A thermal sensor 140 can be coupled to the thermally conductive carbon layer 130. In accordance with embodiments, the thermal sensor 140 can be disposed at the cut-out or aperture 122. In accordance with further embodiments, the thermal sensor 140 includes at least one of a first thermistor 141 that is coupled to a first surface of the thermally conductive carbon layer 130 (i.e., in the section 1331 of the major surface 1330 of the planar layer portion 133) and a second thermistor 142 that is coupled to a second surface of the thermally conductive carbon layer 130, which is perpendicular to the first surface of the thermally conductive carbon layer 130 (i.e., along the sidewall portions 134).

Figure 3:
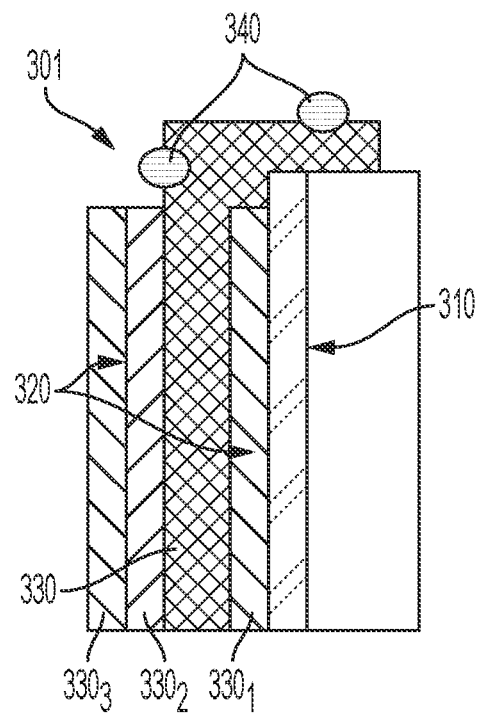
FIG. 3 is a side view of an HEL element in accordance with alternative embodiments.

With reference to FIG. 3 and in accordance with alternative embodiments, an HEL element 301 is provided. The HEL element 301 includes a non-conductive substrate layer 310, a reflector layer assembly 320 with multiple broadband high-reflector layers $320_1, 320_2, \ldots, 320_n$ (only multiple broadband high-reflector layers $320_1, 320_2, 320_3$ are shown), a thermally conductive carbon layer 330 and a thermal sensor 340. The HEL element 301 as a whole and the non-conductive substrate layer 310, the reflector layer assembly 320 and the thermally conductive carbon layer 330 are generally similar to the HEL element 101 of FIGS. 1 and 2, except that the thermally conductive carbon layer 330 is at least partially interposed between first and second ones of the multiple broadband high-reflector layers (i.e., broadband high-reflector layers $320_1$ and $320_2$).

Figure 4:
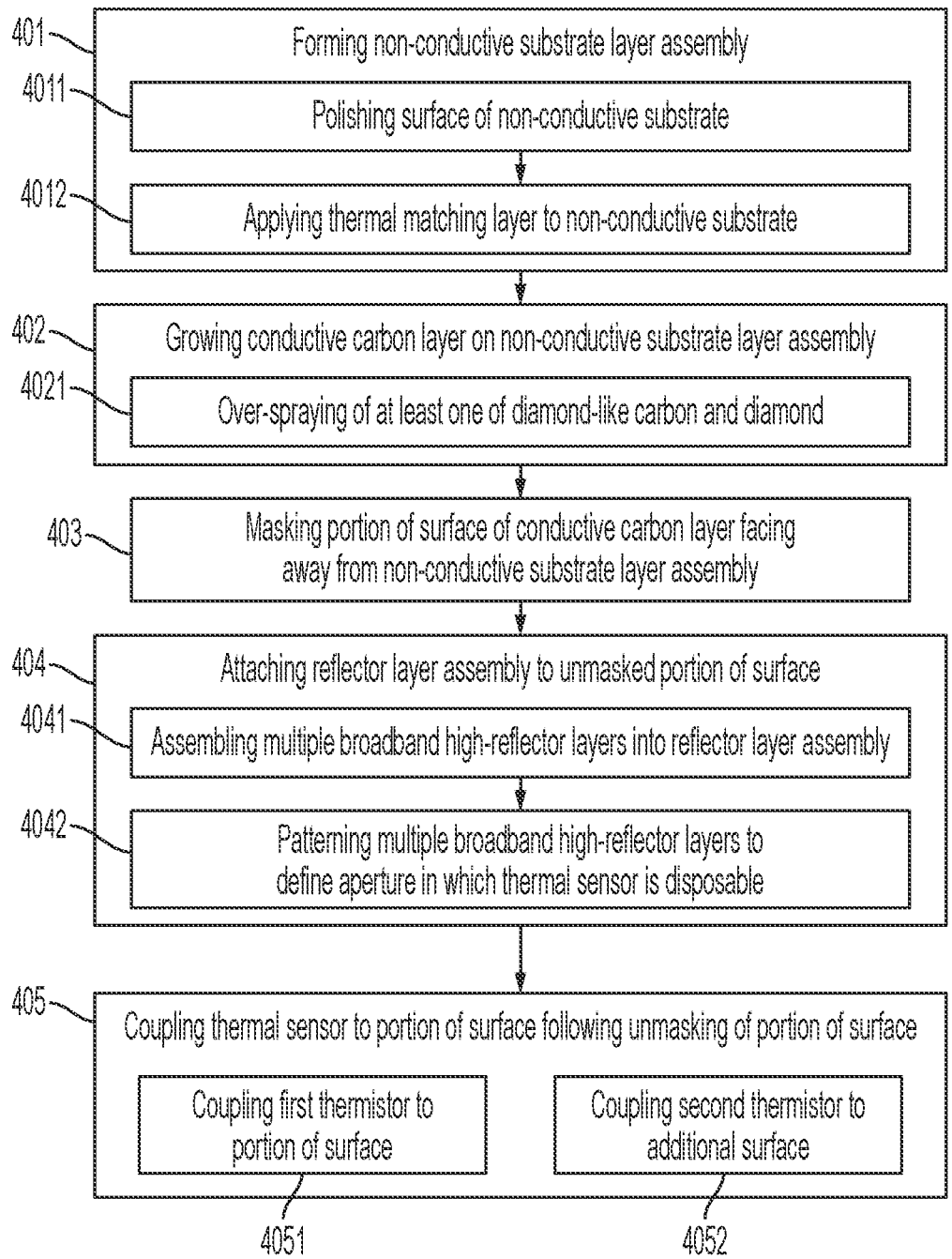
FIG. 4 is a flow diagram illustration a method of assembling an HEL element in accordance with embodiments.

With reference to FIG. 4, a method of assembling a high-energy laser (HEL) element, such as the HEL element 101 of FIGS. 1 and 2 and the HEL element 301 of FIG. 3, is provided. As shown in FIG. 4, the method includes forming a non-conductive substrate layer assembly (401) by, for example, polishing a surface of a non-conductive substrate (4011) and, in some cases, applying a thermal matching layer to the surface of the non-conductive substrate (4012). The method also includes growing a thermally conductive carbon layer on the non-conductive substrate layer assembly (402) by, for example, over-spraying of at least one of diamond-like carbon and diamond (4021). In addition, the method includes masking a portion of a surface of the thermally conductive carbon layer facing away from the non-conductive substrate layer assembly (403), attaching a reflector layer assembly to an unmasked portion of the surface (404) and coupling a thermal sensor to the portion of the surface following an unmasking of the portion of the surface (405). The attaching of the reflector layer assembly to the unmasked portion of the surface of operation 404 can include assembling multiple broadband high-reflector layers into the reflector layer assembly (4041) and patterning the multiple broadband high-reflector layers to define an aperture in which the thermal sensor is disposable (4042). The coupling of the thermal sensor to the portion of the surface of operation 405 can include coupling a first thermistor to the portion of the surface (4051) and coupling a second thermistor to an additional surface perpendicular to the portion of the surface (4052).

In a FOD thermal analysis, a laser beam incident on a lens without a diamond substrate resulted in about a 1,600° C. rise in temperature of the lens (FOD diameter about 5 μm and thickness about 3.33 μm; lens diameter about 5 inches and thickness about 0.5 μm). By contrast, in another FOD thermal analysis, a laser beam incident on a lens with a diamond substrate resulted in only about a 25° C. rise in temperature of the lens (FOD diameter about 5 μm and thickness about 3.33 μm; diamond substrate diameter about 5 inches and thickness about 1 μm; lens diameter about 5 inches and thickness about 0.5 μm).

Technical effects and benefits of the present invention are the provision of an HEL element in which a thermally conductive carbon layer is at least partially interposed between a non-conductive substrate layer assembly and a reflector layer assembly to act as a heat spreader. The thermally conductive carbon layer thus protects at least the non-conductive substrate layer assembly from high temperatures resulting from a laser being incident on FOD on the reflector layer assembly.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A high-energy laser (HEL) element, comprising:
    a non-conductive substrate layer assembly, which is non-conductive of thermal energy;
    a reflector layer assembly; and
    a thermally conductive carbon layer at least partially interposed between the non-conductive substrate layer assembly and the reflector layer assembly,
    wherein the thermally conductive carbon layer comprises a planar layer axially interposed between the non-conductive substrate layer assembly and the reflector layer assembly and sidewalls extending continuously around an entire circumference of an outer periphery of the non-conductive substrate layer assembly along an axial portion of the non-conductive substrate layer assembly, and
    wherein:
    the thermally conductive carbon layer comprises a planar layer portion with a circular major surface,
    the reflector layer assembly is formed with an aperture that exposes a circular chordal segment section of the circular major surface, and
    the HEL element further comprises a thermal sensor coupled to and entirely encompassed within the circular chordal segment section of the circular major surface.

2. The HEL element according to claim 1, wherein the thermally conductive carbon layer comprises at least one of a diamond-like carbon crystal growth layer and/or a diamond crystal growth layer.

3. The HEL element according to claim 1, wherein the non-conductive substrate layer assembly comprises:
    a non-conductive substrate; and
    one or more thermal matching layers interposed between the non-conductive substrate and the thermally conductive carbon layer.

4. The HEL element according to claim 1, wherein the reflector layer assembly comprises multiple broadband high-reflector layers.

5. The HEL element according to claim 1, wherein the reflector assembly comprises multiple reflector layers and the aperture is defined as a chordal section by the multiple reflector layers.

6. The HEL element according to claim 1, wherein the thermal sensor is a first thermistor and the HEL element further comprises a second thermistor coupled to a second surface of the sidewalls, which is perpendicular to the major surface.

7. A high-energy laser (HEL) element, comprising:
    a non-conductive substrate layer assembly;

a reflector layer assembly adjacent to the non-conductive substrate layer assembly and comprising multiple broadband high-reflector layers; and a thermally conductive carbon layer at least partially interposed between first and second ones of the multiple broadband high-reflector layers, wherein:

the thermally conductive carbon layer comprises a planar layer portion with a circular major surface, the reflector layer assembly is formed with an aperture that exposes a circular chordal segment section of the circular major surface, and the HEL element further comprises a thermal sensor coupled to and entirely encompassed within the circular chordal segment section of the circular major surface.

8. The HEL element according to claim 7, wherein the thermally conductive carbon layer comprises at least one of a diamond-like carbon crystal growth layer and/or a diamond crystal growth layer.

9. The HEL element according to claim 7, wherein the non-conductive substrate layer assembly comprises:

a non-conductive substrate; and one or more thermal matching layers interposed between the non-conductive substrate and the reflector layer assembly.

10. A high-energy laser (HEL) element, comprising:

a non-conductive substrate layer assembly, which is non-conductive of thermal energy;

a reflector layer assembly;

a thermally conductive carbon layer at least partially interposed between the non-conductive substrate layer assembly and the reflector layer assembly; and a thermal sensor coupled to the thermally conductive carbon layer, wherein the thermally conductive carbon layer comprises a planar layer portion axially interposed between the non-conductive substrate layer assembly with a circular major surface and the reflector layer assembly and sidewalls extend continuously around an entire circumference of an outer periphery of the non-conductive substrate layer assembly along an axial portion of the non-conductive substrate layer assembly, wherein the reflector layer assembly is formed with an aperture that exposes a circular chordal segment section of the circular major surface and the thermal sensor comprises:

a first thermistor coupled to and entirely encompassed within the circular chordal segment section of the circular major surface of the thermally conductive carbon layer; and a second thermistor coupled to a second surface of the thermally conductive carbon layer, which is perpendicular to the circular major surface of the thermally conductive carbon layer.

11. A method of assembling a high-energy laser (HEL) element, the method comprising:

forming a non-conductive substrate layer assembly;

growing a thermally conductive carbon layer with a circular major surface of a planar layer portion on the non-conductive substrate layer assembly;

masking a portion of a surface of the thermally conductive carbon layer facing away from the non-conductive substrate layer assembly;

attaching a reflector layer assembly to an unmasked portion of the surface, wherein the thermally conductive carbon layer comprises the circular major surface of the planar layer axially interposed between the non-conductive substrate layer assembly and the reflector layer assembly and sidewalls extending around a portion of the non-conductive substrate layer assembly, the reflector layer assembly being formed with an aperture that exposes a circular chordal segment section of the circular major surface; and coupling a thermal sensor to the portion of the surface following an unmasking of the portion of the surface such that the thermal sensor is coupled to and entirely encompassed within the circular chordal segment section of the circular major surface.

12. The method according to claim 11, wherein the forming of the non-conductive substrate layer assembly comprises polishing a surface of a non-conductive substrate.

13. The method according to claim 12, wherein the forming of the non-conductive substrate layer assembly further comprises applying one or more thermal matching layers to the surface of the non-conductive substrate.

14. The method according to claim 11, wherein the growing of the thermally conductive carbon layer comprises over-spraying of at least one of diamond-like carbon and/or diamond.

15. The method according to claim 11, wherein the attaching of the reflector layer assembly to the unmasked portion of the surface comprises:

assembling multiple broadband high-reflector layers; and patterning the multiple broadband high-reflector layers to define an aperture in which the thermal sensor is disposable.

16. The method according to claim 11, wherein the coupling of the thermal sensor to the portion of the surface comprises:

coupling a first thermistor to the portion of the surface such that the first thermistor is coupled to and entirely encompassed within the circular chordal segment section of the circular major surface; and coupling a second thermistor to an additional surface perpendicular to the portion of the surface.

* * * * *